United States Patent
Loke et al.

(10) Patent No.: US 7,123,001 B2
(45) Date of Patent: Oct. 17, 2006

(54) DELAY-LOCKED LOOP AND A METHOD OF TESTING A DELAY-LOCKED LOOP

(75) Inventors: Alvin Leng Sun Loke, Fort Collins, CO (US); Michael Joseph Gilsdorf, Fort Collins, CO (US); Peter Jacob Meier, Fort Collins, CO (US); Jeffrey R. Rearick, Fort Collins, CO (US)

(73) Assignee: Avago Tehnologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 11/351,173

(22) Filed: Feb. 9, 2006

(65) Prior Publication Data

US 2006/0139023 A1    Jun. 29, 2006

Related U.S. Application Data

(62) Division of application No. 10/869,582, filed on Jun. 16, 2004, now Pat. No. 6,995,554.

(51) Int. Cl.
*G01R 23/175*    (2006.01)
(52) U.S. Cl. .................. 324/76.54; 324/76.11
(58) Field of Classification Search ............. 324/76.54; 327/158
See application file for complete search history.

(56) References Cited

U.S. PATENT DOCUMENTS

| | | | |
|---|---|---|---|
| 5,675,274 A | * | 10/1997 | Kobayashi et al. ......... 327/158 |
| 5,717,353 A | | 2/1998 | Fujimoto |
| 2003/0067332 A1 | | 4/2003 | Mikhalev et al. |

* cited by examiner

*Primary Examiner*—Vincent Q. Nguyen

(57) ABSTRACT

A delay-locked loop (DLL) of an integrated circuit (IC) with testing circuitry and a method for testing a DLL. During test mode, a phase comparator of the DLL receives a test clock in place of the reference clock and determines the phase difference between the test clock and the clock fed back to the DLL from a clock buffer tree. A variable delay element of the DLL then shifts the reference clock in time by an amount that depends on that phase difference. The variable delay element can be exercised by varying the phase of the test clock with respect to the reference clock by a known phase offset to cause the variable delay element to produce a range of delays. Whether the variable delay element is functioning properly can be determined by checking whether the phase of the test clock is aligned with the phase of the feedback clock.

6 Claims, 6 Drawing Sheets

DELAY-LOCKED LOOP AND A METHOD OF TESTING A DELAY-LOCKED LOOP

CROSS REFERENCE TO RELATED APPLICATION

This application is a divisional application of application Ser. No. 10/869,582, filed on Jun. 16, 2004 now U.S. Pat. No. 6,995,554, which is incorporated herein by reference in its entirety.

TECHNICAL FIELD OF THE INVENTION

The present invention relates to integrated circuits (ICs). More particularly, the present invention relates to a delay-locked loop (DLL) that includes logic that enables the DLL to be tested, and a method of testing a DLL.

BACKGROUND OF THE INVENTION

An IC typically employs a reference clock in order to control the timing of events and ensure that movement of data signals are correlated to each other in the IC. Such synchronously clocked ICs contain many memory elements or registers, sometimes as many as tens of millions, all of which need to receive the reference clock signal simultaneously. Since the reference clock signal normally does not have sufficient strength to simultaneously drive all of the registers without signal degradation, clock buffer trees are normally incorporated into the IC to effectively amplify the drive strength of the reference clock signal. Clock buffer trees receive the reference clock and generate much stronger output signals for appropriately driving the registers. The clock buffer trees normally comprise multiple stages, with the number of buffers in each successive stage increasing geometrically over the number of buffers in the immediately preceding stage. The outputs of the buffers of the last stage become the clocks that drive the registers. Each buffer in the last stage typically drives only 5 to 10 registers.

Each buffer stage in the clock buffer tree delays the reference clock signal by some amount of time due to its intrinsic propagation delay. The clock buffer tree is carefully designed to ensure that the propagation delay of all buffers in the same stage are matched. If a proper design is achieved, the buffer tree clock, which corresponds to the outputs of the buffers of the last stage, will synchronously drive all of the registers with multiple output clocks that are replicas of the reference clock input, but shifted in time by a delay that is the sum of propagation delays from the first to the last stage of buffering. This delay is commonly known as clock insertion delay.

With a properly designed and balanced clock buffer tree, the clock insertion delay should be independent of the path of buffer stages that the clock signal traverses before reaching the registers. However, this overall delay produced by the buffer tree can vary due to IC manufacturing process, supply voltage, and temperature variations, known as PVT variations, as well as output load variations. In other words, the buffer tree clock fluctuates with time during normal operation of the IC. This is not a problem if the IC does not require a known, unvarying phase relationship between the buffer tree clock and the reference clock. However, synchronous ICs require a known, unvarying relationship between the buffer tree clock and the reference clock. For these ICs, delay-locked loops (DLLs) are typically used to remove on-chip clock insertion delay in order to maintain a substantially unvarying relationship between the buffer tree clock and the reference clock. A DLL is a negative feedback control system that tracks the delay in the clock buffer tree so as to maintain phase alignment between the phase of the buffer tree clock and that of the reference clock.

A known DLL is shown in FIG. 1. The DLL 1 receives as one of its inputs the system reference clock, $CLK_{REF}$. The other input of the DLL 1 corresponds to the output 2 of the clock buffer tree 3 that drives the registers' 4, which will be referred to as the buffer tree clock, $CLK_{TREE}$. The buffer tree clock $CLK_{TREE}$ is the feedback used by the DLL 1 to maintain phase alignment of the buffer tree clock $CLK_{TREE}$ to the reference clock $CLK_{REF}$. Therefore, the buffer tree clock $CLK_{TREE}$ will sometimes be referred to herein as the feedback clock. The DLL 1 has a phase comparator 5 that receives $CLK_{REF}$ and $CLK_{TREE}$ and compares the magnitude and polarity of their phases. The output of the phase comparator 5 is a phase difference signal. A first order loop filter 6 extracts the direct current (dc) component from the output of the phase comparator 5 so that the signal driving the variable delay element 7 is stable and does not pulse A pulsed input to the variable delay element 7 would generate a corresponding pulsed variable delay and introduce undesirable jitter or timing variations in the output clock. The output of the filter 6 causes the variable delay element 7 to delay $CLK_{REF}$ by an amount that ensures that the phase of $CLK_{TREE}$ will remain aligned with the phase of $CLK_{REF}$. This is achieved with a DLL 1 output clock $CLK_{DLL}$ that is effectively shifted back in time by the clock insertion delay in the clock buffer tree 3. Thus, with the edges of $CLK_{TREE}$ and $CLK_{REF}$ kept aligned in time by the DLL 1, the registers are effectively clocked by $CLK_{REF}$.

As stated above, PVT variations can cause the delay produced by the clock buffer tree 3 to vary. Consequently, the delay produced by the clock buffer tree 3 can increase or decrease. If the delay produced by the clock buffer tree 3 increases by a certain amount of time, then the phase comparator 5 will steer the variable delay element 7 to produce a delay that is decreased by that same amount to maintain phase alignment at the clock buffer tree output. Conversely, if the delay produced by the clock buffer tree 3 decreases, then the delay produced by the variable delay element 7 will correspondingly increase. In both cases, the variable delay element 7 shifts $CLK_{REF}$ to maintain phase alignment between $CLK_{REF}$ and $CLK_{TREE}$.

Because the delays produced by the clock buffer tree 3 can vary over a range of delays due to PVT and register load conditions, the DLL 1 should be capable of delaying the reference clock over a range of delays. Currently, there is no way to test a DLL to determine whether it works over the range of delays needed to maintain alignment between $CLK_{REF}$ and $CLK_{TREE}$. To date, DLLs are tested by turning the IC on and verifying DLL functionality under some fixed PVT and load conditions corresponding to a constant clock tree buffer delay. Of course, the DLL may work under the conditions and clock buffer tree delay existing at that time and yet not work over a range of conditions and clock buffer tree delays. Consequently, an IC that is determined to work properly when tested in this manner may not work properly in the environment in which it is later employed by the end user. Accordingly, a need exists for a DLL that can be tested over a range of delays and a method for testing the DLL exhaustively over a range of delays.

SUMMARY OF THE INVENTION

The present invention provides a delay-locked loop (DLL) of an integrated circuit (IC) configured with testing circuitry and a method for testing a DLL. During a normal operation mode, a phase comparator of the DLL receives a reference clock and a feedback clock and compares the reference clock phase with the feedback clock phase in order to determine the phase difference between the clocks. The feedback clock corresponds to the output of the clock buffer tree that drives the registers of the IC. A variable delay element of the DLL then shifts the reference clock in time by an amount that depends on the magnitude and polarity of the phase difference. In the normal operation mode, a fixed phase relationship always exists between the input to the phase comparator and the input to the variable delay element. On the contrary, during a test mode, the phase relationship between the input to the phase comparator and the input to the variable delay element can be varied. The phase comparator receives a test clock and the feedback clock and determines the difference between the phase of the test clock and the phase of the feedback clock. The variable delay element then shifts the reference clock in time by an amount that depends on that phase difference. Since the phase relationship between the input to the phase comparator and the input to the variable delay element is now a function of the phase difference between the test clock and reference clock, the variable delay element can be exercised to produce a range of delays by varying the phase of the test clock with respect to the reference clock.

In accordance with the preferred embodiment of the invention, a selector switch, which preferably is a 2-to-1 multiplexer (MUX), receives as its inputs the reference clock and the test clock. During the normal mode of operation, the MUX selects the reference clock to be input to the phase comparator along with the feedback clock. During the test mode, the MUX selects the test clock to be input to the phase comparator along with the feedback clock.

Preferably, the feedback clock from the clock buffer tree is also input to both inputs of a second 2-to-1 MUX that has its output connected to the second input of the phase comparator. Therefore, the feedback clock is provided to the phase comparator regardless of which input of the second MUX is selected. The second MUX is optional, but preferred. The second MUX ensures that the propagation delay of the first MUX is replicated in the feedback clock path so as to avoid a static phase offset error of the MUX delay between the reference and feedback clocks.

In accordance with one embodiment, the test clock is provided via an input/output (I/O) pad of the IC. In accordance with another embodiment, the test clock corresponds to the DLL output clock of another DLL of the IC. In accordance with another embodiment, the test clock corresponds to a reference clock of another DLL of the IC. In accordance with another embodiment, the test clock corresponds to the output clock of a phase-locked loop (PLL). In accordance with yet another embodiment, multiple DLLs of an IC use each other's reference clocks as their respective test clocks.

The method of the invention, in accordance with the preferred embodiment, includes inserting a test clock into the DLL with a phase that has a predetermined offset from the phase of the reference clock and then verifying whether the phase of the resulting feedback clock is aligned with the phase of the test clock. The verification step can be performed directly or indirectly using a variety of approaches. The direct approach involves: (1) porting the feedback clock to an output clock observation pad of the IC and (2) observing the feedback clock waveform using a measurement instrument such as an oscilloscope, for example, or an instrument that performs the equivalent function of an oscilloscope. The test clock is already available for measuring because it is being input to the DLL. Using such an instrument, the feedback clock and the test clock waveforms can be observed in the time domain to confirm phase alignment. This approach requires an additional I/O pad for sampling the feedback clock.

Another approach that may be used to verify phase alignment of the feedback clock and the test clock is an indirect approach that implements a lock detector on the IC that determines whether the phase error between the feedback clock and the test clock is bounded to a small value. The lock detector could be configured to output some flag to indicate lock status. The value of the flag could then be retrieved through, for example, a scan test. The lock detector could be implemented as part of the DLL phase comparator or as part of the DLL first order loop filter. These are only a few examples of the many approaches that are available for verifying phase alignment.

These and other features and advantages of the invention will become apparent from the following description, drawings and claims.

DETAILED DESCRIPTION OF THE PREFERRED EMBODIMENT

Figure 1:
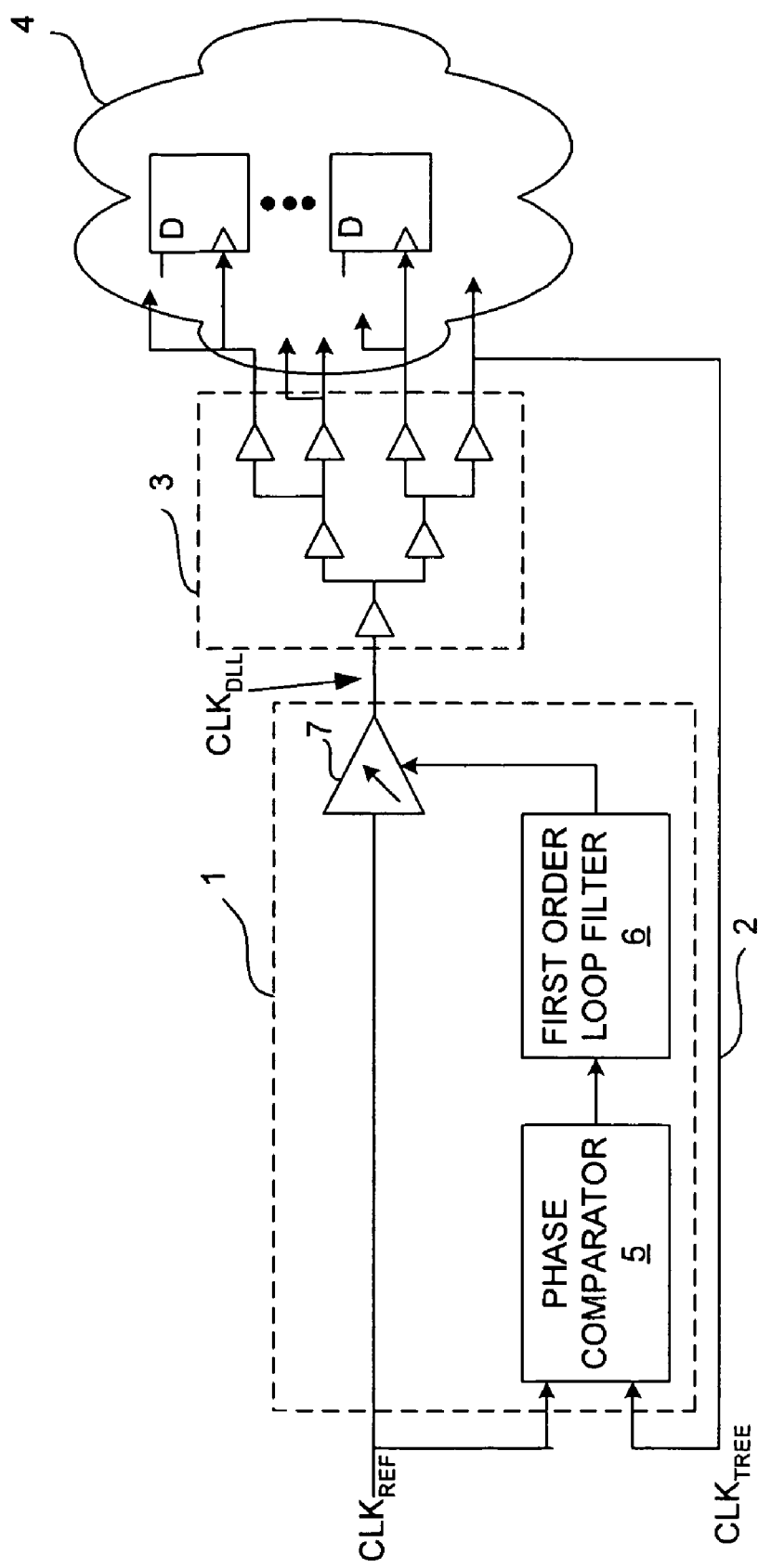
FIG. 1 illustrates a block diagram of a known DLL.
Figure 2:
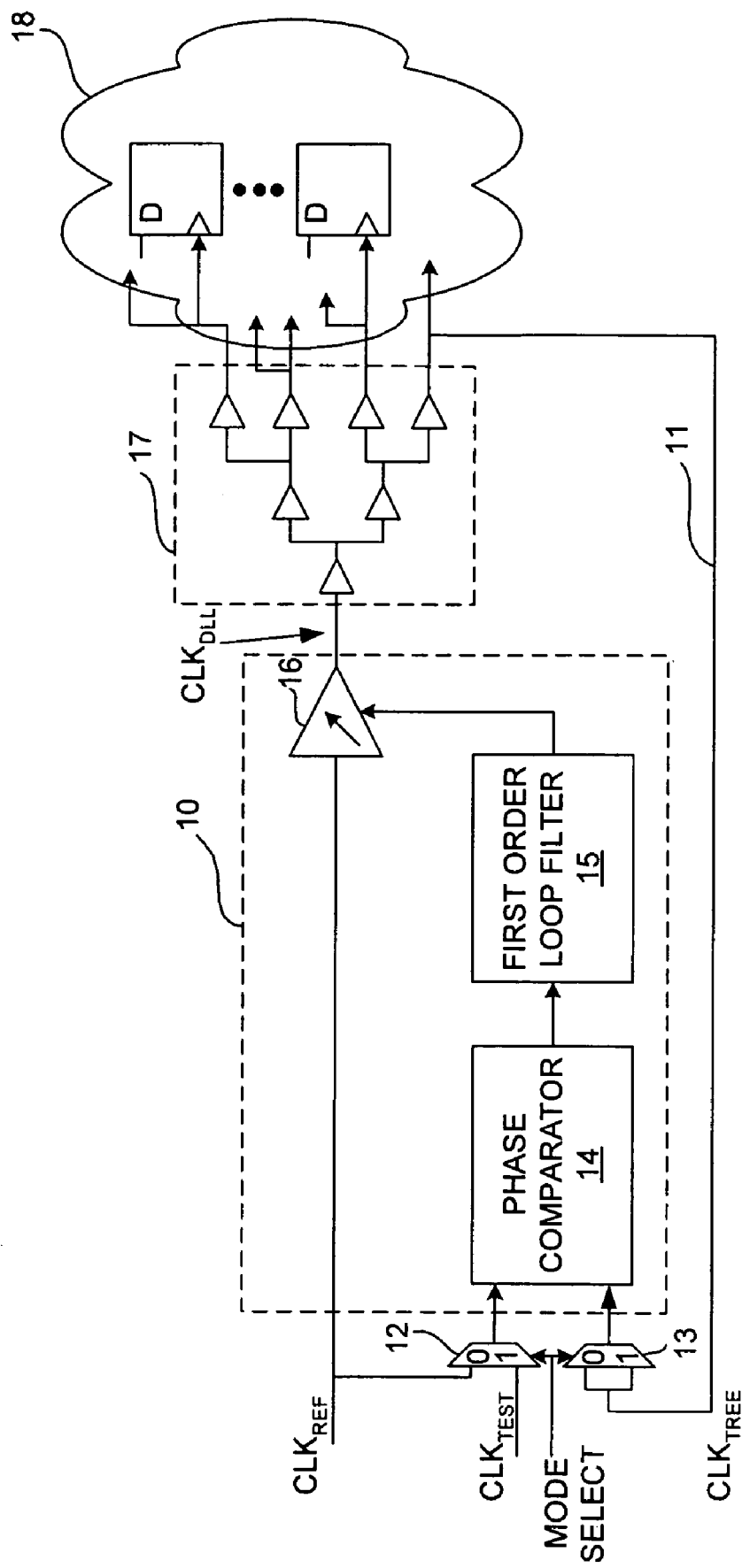
FIG. 2 illustrates a block diagram of a DLL having test circuitry in accordance with an embodiment of the present invention.

In accordance with the present invention, a DLL is provided that includes test circuitry that allows a test clock to be input to the DLL to cause the variable delay element inside the DLL to be exercised. FIG. 2 is a block diagram of the DLL 10 of the present invention in accordance with an exemplary embodiment. The DLL 10 has two multiplexers (MUX) 12 and 13 that control the selection of signals input to the phase comparator 14 of the DLL 10. The MUX 12 selects either the test clock, $CLK_{TEST}$, or the reference clock, $CLK_{REF}$. When the mode select signal is not asserted, the MUX 12 selects $CLK_{REF}$ to be input to the phase comparator 14. When the mode select signal is asserted, the MUX 12 selects $CLK_{TEST}$ to be input to the phase comparator 14.

MUX 13, which is optional, receives the clock of clock buffer tree 17, $CLK_{TREE}$, on feedback path 11 at both of its inputs. Therefore, regardless of the state of the mode select signal, $CLK_{TREE}$ will always be selected to be input to the phase comparator 14. The buffer tree clock $CLK_{TREE}$ also drives the registers 18. The only purpose for the MUX 13 is to provide a matching delay equal to the propagation delay introduced by the MUX 12. During normal operation, the mode select signal is deasserted and the MUX 12 selects $CLK_{REF}$ to be input to the phase comparator 14. The phase comparator 14 compares the phase of $CLK_{REF}$ with the phase of $CLK_{TREE}$. The variable delay element 16 adjusts the amount by which it delays $CLK_{REF}$ in accordance with the difference detected by the phase comparator 14. The filter 15 filters out the dc component of the signal produced by the phase comparator 14. The variable delay element 16 will continue to make adjustments until $CLK_{REF}$ is phase aligned with $CLK_{TREE}$.

In order to test the DLL 10, the mode select signal is asserted so that the phase comparator 14 receives $CLK_{TEST}$ in place of $CLK_{REF}$ as one of its inputs. The phase comparator 14 receives $CLK_{TREE}$ as the other of its inputs. The phase comparator 14 determines the phase difference between $CLK_{TREE}$ and $CLK_{TEST}$ and the variable delay element 16 adjusts the amount by which it delays the reference clock $CLK_{REF}$ based on the detected phase difference. By shifting the test clock $CLK_{TEST}$ forward or backward in time with respect to $CLK_{REF}$ to provide a phase offset between $CLK_{REF}$ and $CLK_{TEST}$, the variable delay element 16 is forced to operate over a range of delays as it attempts to phase align the DLL output clock, $CLK_{DLL}$, with the test clock, $CLK_{TEST}$. Thus, the DLL 10 can be tested over a range of delays in order to determine how well the DLL 10 will perform its necessary functions when PVT and operating conditions change. In essence, modulating the phase of the test clock $CLK_{TEST}$ with respect to the phase of the reference clock $CLK_{REF}$ simulates clock skew variations, thereby exercising the variable delay element 16 to output a range of delays expected over operating conditions.

As indicated above, the MUX 13 is not critical and can be omitted where the propagation delay created by the MUX 13 is small and can be treated as an insignificant timing error. In cases where the range of delays that can be generated by the variable delay element 16 is extremely limited, inserting a delay between the reference clock input and the variable delay element 16 that replicates the MUX 12 delay in the phase comparator 14 input path will preserve the range of the variable delay element 16. However, it is believed that such an additional delay element is not necessary due to the very small propagation delay created by MUX 12 relative to the range of delays typically provided by the variable delay element 16 in a practical DLL 10.

The present invention is not limited to DLLs of the type shown in FIG. 2. It is equally applicable to all types of DLL configurations, such as, for example, those that include dual-loop architectures where the reference clock input corresponds to the output of another DLL or phase-locked loop (PLL). Of course, if another DLL is employed in a dual-loop architecture, it can also be tested using the invention in the same fashion as described above with reference to FIG. 2.

Figure 3:
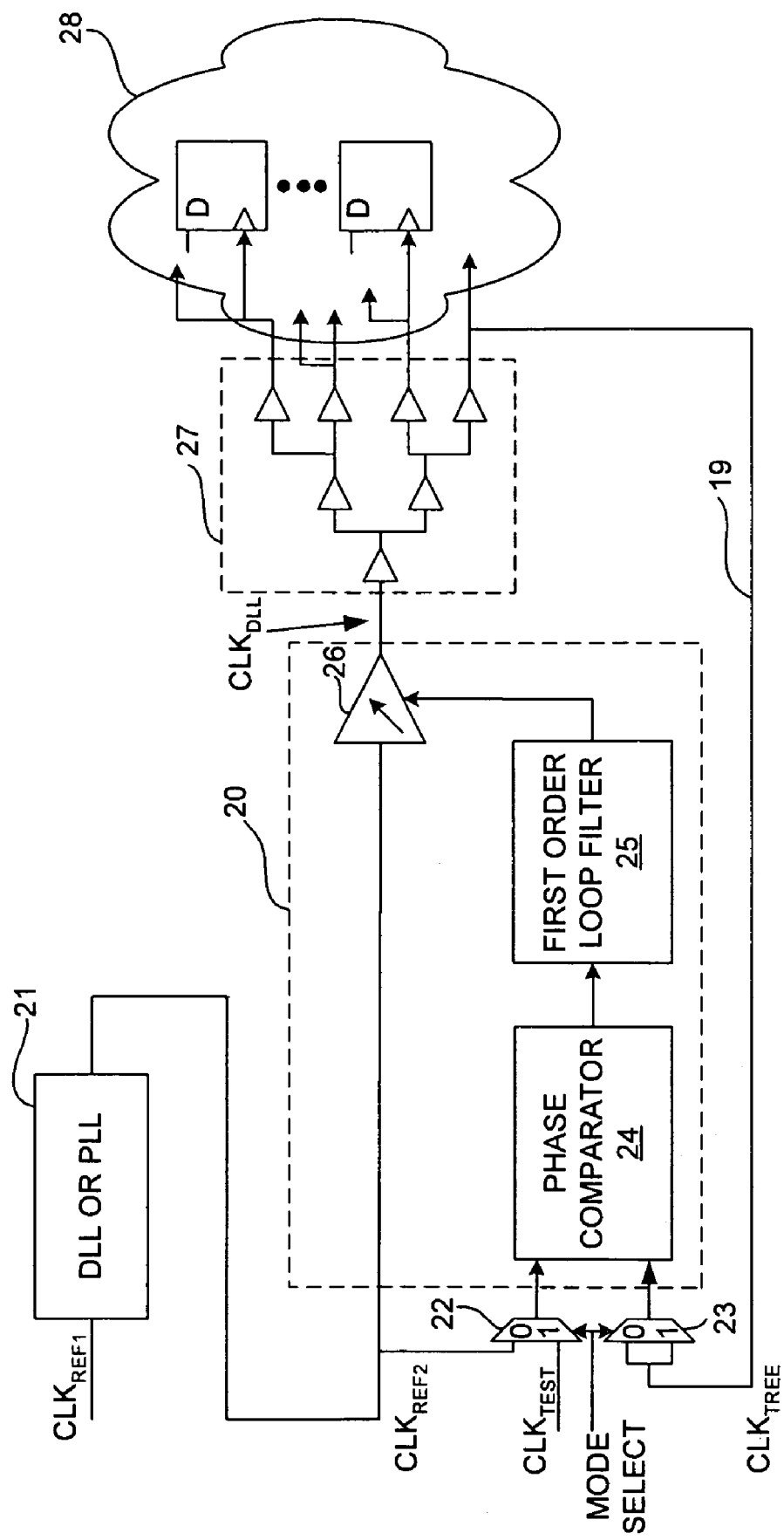
FIG. 3 illustrates a block diagram of another DLL having test circuitry in accordance with the invention, and which uses as its reference clock the output clock of a different DLL or PLL on the IC.

FIG. 3 is a block diagram of a dual-loop architecture that employs the DLL testing circuitry of the present invention to test DLL 20. It is common in ICs that the reference clock $CLK_{REF}$ of a DLL corresponds to the output clock of another DLL or of a phase-locked loop (PLL). The embodiment shown in FIG. 3 is useful in cases in which the output clock of the DLL 20 has a relatively high frequency, thus requiring a high-frequency DLL reference clock input that would be impractically high if it were provided by an external clock through an input/output (I/O) pad (not shown). In FIG. 3, the reference clock $CLK_{REF2}$ of the DLL 20 corresponds to the output clock of a DLL or PLL 21, which receives a reference clock $CLK_{REF1}$. Therefore, rather than the reference clock of DLL 20 being an external clock input to the IC through an I/O pad of the IC, the reference clock $CLK_{REF2}$ corresponds to the output clock of another DLL or PLL 21.

The DLL 20 operates in the same manner as the DLL 10 shown in FIG. 2, except that the variable delay element 26 of the DLL 20 attempts to phase align the output clock of DLL or PLL 21 with the $CLK_{TREE}$ output of the clock buffer tree 27. The components 22–26 shown in FIG. 3 may be identical to and operate in the same manner as the components 12–16, respectively, shown in FIG. 2. When the mode select signal is deasserted, the MUX 22 selects the output clock of the DLL or PLL 21 as its reference clock to be input to the phase comparator 24. The phase comparator 24 determines the phase difference between the reference clock $CLK_{REF2}$ and the output of the clock buffer tree 27 $CLK_{TREE}$ fed back to the DLL 20 on feedback path 19. The variable delay element 26 adjusts the phase of $CLK_{REF2}$ to cause it to be aligned with the phase of $CLK_{TREE}$.

In the test mode, the mode select signal is asserted and the MUX 22 selects the test clock signal $CLK_{TEST}$ to be input to the phase comparator 24. The phase comparator 24 then determines the phase difference between the test clock signal $CLK_{TEST}$ and the feedback clock signal $CLK_{TREE}$ and the variable delay element 26 adjusts the phase of $CLK_{REF2}$ so that $CLK_{TREE}$ is aligned with $CLK_{TEST}$. As indicated above with reference to FIG. 2, by varying the phase offset between $CLK_{TEST}$ and $CLK_{REF2}$, the variable delay element 26 is forced to operate over a range of delays to cause $CLK_{REF2}$ to be phase aligned with $CLK_{TREE}$.

Figure 4:
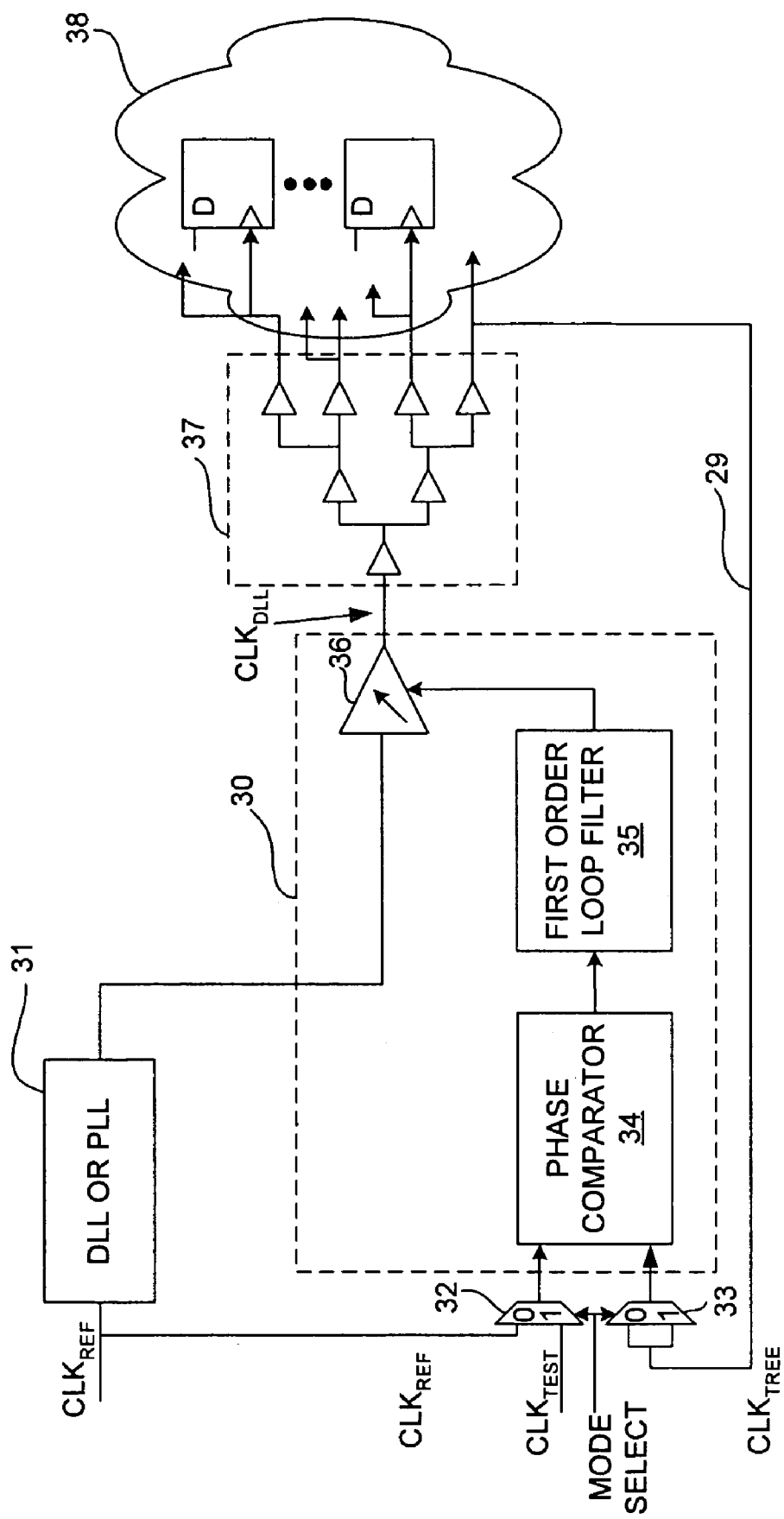
FIG. 4 illustrates a block diagram of another DLL having test circuitry in accordance with the invention, and which uses as its reference clock the same reference clock used by a different DLL or PLL on the IC.

FIG. 4 is a block diagram of a DLL 30 in accordance with another embodiment of the invention. In accordance with this embodiment, the DLL 30 and a DLL or PLL 31 share the same reference clock $CLK_{REF}$ and the input to the variable delay element 36 corresponds to the output clock of the DLL or PLL 31. This type of dual-loop architecture is common in DLLs that employ a phase interpolator in place of a conventional variable delay line as the variable delay element. One of the advantages of this embodiment is that it allows the output of the variable-delay element 36, which may be, for example, a variable-delay line or phase interpolator, to be independently swept by creating an independent phase (or delay) offset between the clock and control inputs to the variable-delay element 36.

The embodiments described above with reference to FIGS. 2–4 utilize an additional input for the test clock signal $CLK_{TEST}$. This additional input is typically provided by an additional I/O input pad on the IC. Adding an additional I/O pad per DLL on the chip may be costly in terms of silicon real estate and may not always be practical. The embodiment shown in FIG. 5, which represents one of several possible alternative approaches, does not require an additional I/O pad for the test clock. In this exemplary embodiment, a single I/O pad is shared by multiple DLLs on the same IC. If a single I/O pad is not available, an alternative is to borrow a reference clock input that would normally synchronize another clock domain and test different clock domains independently. The manner in which this latter approach is accomplished will now be described with reference to FIG. 5.

Figure 5:
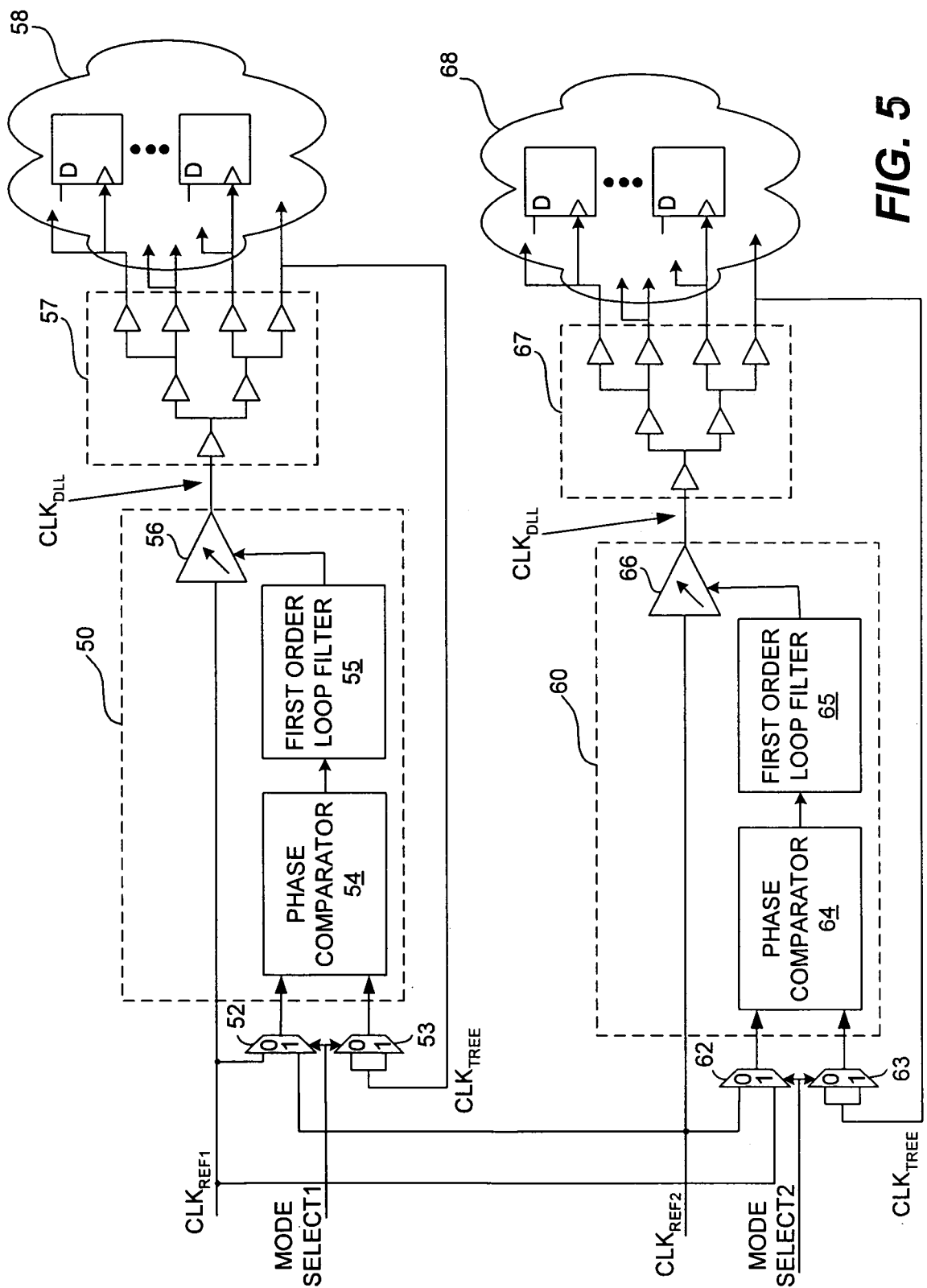
FIG. 5 illustrates a block diagram of two DLLs on an IC that each use the reference clock of the other DLL as the test clock.

FIG. 5 illustrates a block diagram of first and second DLLs 50 and 60 of the type shown in FIG. 2. The DLLs 50 and 60 receive and use each other's reference clocks as test clocks during test mode. The MUX 52 of DLL 50 receives the reference clock of DLL 50, $CLK_{REF1}$, as one of its inputs, and the reference clock of DLL 60, $CLK_{REF2}$, as the other of its inputs. Similarly, MUX 62 of DLL 60 receives the reference clock of DLL 60, $CLK_{REF2}$, as one of its inputs, and the reference clock of DLL 50, $CLK_{REF1}$, as the other of its inputs. Therefore, the reference clock for DLL 50 is used as the test clock for DLL 60 and the reference clock for DLL 60 is used as the test clock for DLL 50. In all other respects, the other components of the DLLs 50 and 60 operate in the same manner as the components of the DLLs shown in FIGS. 2–4 and described above in detail. Therefore, a detailed description of components 52–56 and 62–66 of DLLs 50 and 60 will not be provided.

Figure 6:
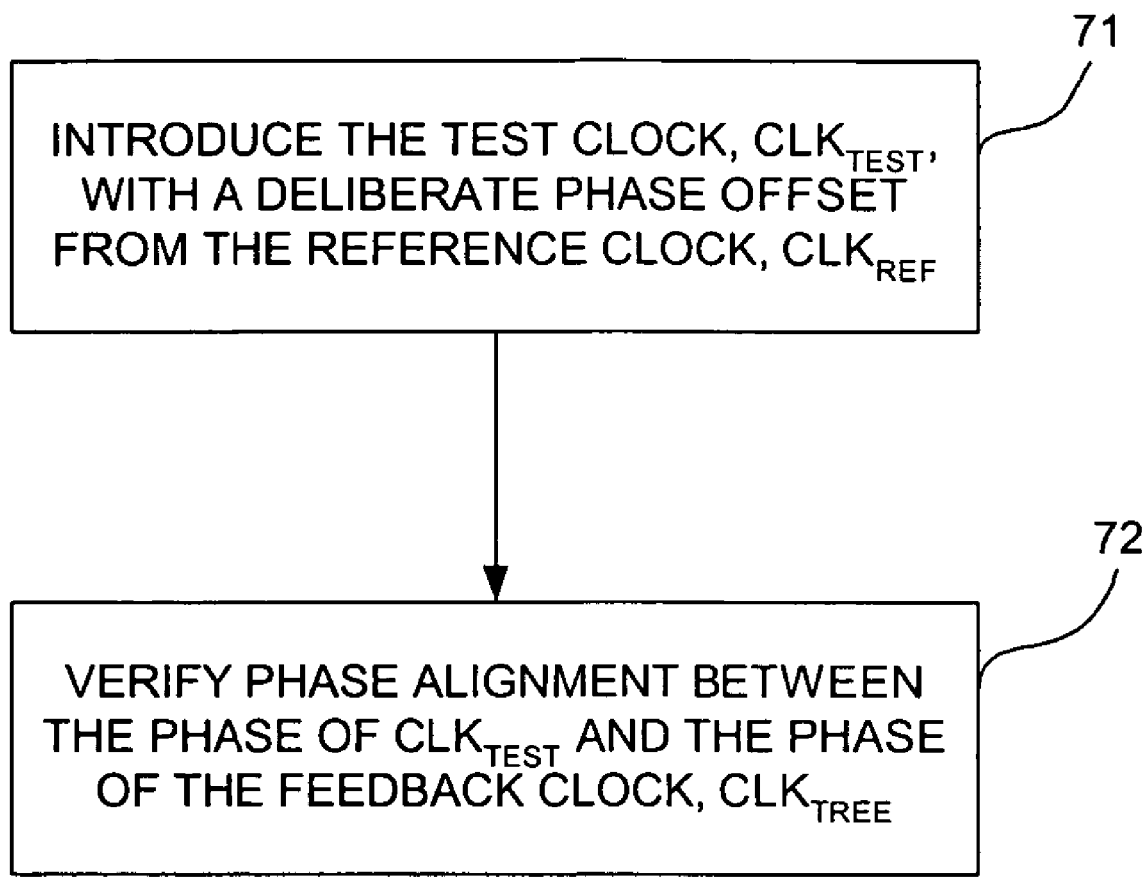
FIG. 6 illustrates a flow chart of the method of the present invention in accordance with an embodiment for testing a DLL.

FIG. 6 illustrates a flow chart of the method of the present invention in accordance with an embodiment for testing a DLL. In the test mode, a test clock signal $CLK_{TEST}$ is introduced with a deliberate phase offset from the reference clock $CLK_{REF}$, as indicated by block 71. This will force the variable delay element in the DLL to generate a $CLK_{DLL}$ output that will cause the phase of $CLK_{TREE}$ to align with the phase of $CLK_{TEST}$. DLL functionality is confirmed by verifying phase alignment between the test clock $CLK_{TEST}$ and the clock buffer tree output $CLK_{TREE}$, as indicated by block 72. For exhaustive testing of the variable delay element, the above test procedure is repeated over a range of deliberate phase offsets in the test clock signal.

A variety of approaches can be used to verify phase alignment between $CLK_{TREE}$ and $CLK_{TEST}$. The first is a direct approach, which involves: (1) porting $CLK_{TREE}$ to an output clock observation pad of the IC and (2) observing the waveform using a measurement instrument such as an oscilloscope, for example, or an instrument that performs the equivalent function of an oscilloscope. The test clock is already available for measuring because it is being input to the DLL. Using such an instrument, the $CLK_{TREE}$ and $CLK_{TEST}$ waveforms can be observed in the time domain to confirm phase alignment. This approach requires an additional I/O pad for sampling $CLK_{TREE}$.

Another approach that may be used to verify phase alignment of $CLK_{TREE}$ and $CLK_{TEST}$ is an indirect approach that implements a lock detector on the IC that determines whether the phase error between $CLK_{TREE}$ and $CLK_{TEST}$ is bounded to a small value. The lock detector could be configured to output some flag to indicate lock status. The value of the flag could then be retrieved through, for example, a scan test. The lock detector could be implemented as part of the DLL phase comparator or as part of the DLL first order loop filter. It should be noted that these are only a few examples of the many approaches that are available for verifying phase alignment. The present invention is not limited to these approaches, but encompasses all approaches and apparatuses for verifying phase alignment.

System-on-a-chip (SOC) production testers currently are available that generate multiple clocks that have known phase relationships. Such a tester may be used to inject the test clock into the IC with a preselected phase offset relative to the phase of the reference clock. SOC production testers also have multiple channels for receiving multiple clocks so that the phase relationship between the clocks can be observed and verified on a scope of the tester. In the example of the direct approach given above, the test clock would be on one channel of the tester and the feedback clock would be fed into another channel of the tester. The tester will then determine and display the phase relationship between the signals so that phase alignment can be verified.

It can be seen from the above description of the preferred embodiments that the present invention provides a mechanism for testing DLL functionality across an arbitrary feedback delay at any frequency of interest. Various embodiments have been shown to demonstrate the principles and concepts of the invention. However, it should be understood that the invention is not limited to the embodiments described herein. Modifications may be made to the embodiments described herein, and all such modifications are within the scope of the invention. For example, although FIGS. 2–5 show multiplexers used to provide the ability to switch from the normal mode of operation to the test mode, it will be understood from the description provided herein that many other configurations can be used to provide this switching ability. For example, the multiplexing function can be equivalently implemented using conventional Boolean combinational logic. It should also be noted that the phase comparator, first order loop filter and the variable delay element can be implemented using a variety of different components. The invention is not limited with respect to the manner in which these components are implemented.

What is claimed is:

1. A delay-locked loop (DLL) circuit comprising:
    a first DLL; and
    a second DLL, wherein the first DLL comprises:
        a first phase comparator configured to compare a phase of a first feedback clock with a phase of a second reference clock of the second DLL to determine a first phase difference; and
        a first variable delay element configured to receive input relating to the first phase difference determined by the first phase comparator and to delay a first reference clock by an amount that depends on the determined first phase difference;
    and wherein the second DLL comprises:
        a second phase comparator configured to compare a phase of a second feedback clock with a phase of the first reference clock of the first DLL to determine a second phase difference; and
        a second variable delay element configured to receive input relating to the second phase difference determined by the second phase comparator and to delay said second reference clock by an amount that depends on the determined second phase difference.

2. The DLL circuit of claim 1, wherein the first reference clock has an end coupled to an input/output (I/O) pad of the IC.

3. The DLL circuit of claim 2, wherein the second reference clock has an end coupled to an input/output (I/O) pad of the IC.

4. The DLL circuit of claim 1, further comprising:
    a first selector switch having a first input that receives the first reference clock, a second input that receives the second reference clock and an output coupled to a first input of the first variable phase comparator; and
    a second selector switch having a first input that receives the second reference clock, a second input that receives the first reference clock and an output coupled to a first input of the second variable phase comparator.

5. The DLL circuit of claim 4, wherein the first phase comparator has a second input that receives a first feedback clock, and wherein during a normal operation mode, the first selector switch selects the first reference clock and the first phase comparator compares the first reference clock with the first feedback clock and determines a third phase difference between the first reference clock and the first feedback clock, and wherein during a test mode, the first selector switch selects the second reference clock and the first phase comparator compares the second reference clock with the first feedback dock and determines said first phase difference, and wherein during the normal operation mode, the first variable delay element delays the first reference clock by an amount that depends on said third phase difference, and wherein during the test mode, the first variable delay element delays the first reference clock by an amount that depends on said first phase difference.

6. The DLL circuit of claim 4, wherein the second phase comparator has a second input that receives a second feedback clock, and wherein during a normal operation mode, the second selector switch selects the second reference clock and the second phase comparator compares the second reference clock with the second feedback clock and determines a fourth phase difference between the second reference clock and the second feedback clock, and wherein during a test mode, the second selector switch selects the first reference clock and the second phase comparator compares the first reference clock with the second feedback clock and determines said second phase difference, and wherein during the normal operation mode, the second variable delay element delays the second reference clock by an amount that depends on said fourth phase difference, and wherein during the test mode, the second variable delay element delays the second reference clock by an amount that depends on said second phase difference.

* * * * *

UNITED STATES PATENT AND TRADEMARK OFFICE
CERTIFICATE OF CORRECTION

| | |
|---|---|
| PATENT NO. | : 7,123,001 B2 |
| APPLICATION NO. | : 11/351173 |
| DATED | : October 17, 2006 |
| INVENTOR(S) | : Alvin Leng Sun Loke et al. |

Page 1 of 1

It is certified that error appears in the above-identified patent and that said Letters Patent is hereby corrected as shown below:

Cover Page, item (73) (Assignee), Line 1, delete "Tehnologies" and insert -- Technologies --;

Column 8, Line 63, Claim 5, delete "dock" and insert -- clock --.

Signed and Sealed this

First Day of June, 2010

David J. Kappos
*Director of the United States Patent and Trademark Office*